United States Patent
Lin et al.

(10) Patent No.: US 10,833,091 B2
(45) Date of Patent: Nov. 10, 2020

(54) FERROELECTRIC MEMORIES

(71) Applicant: Industrial Technology Research Institute, Hsinchu (TW)

(72) Inventors: Yu-De Lin, Taoyuan (TW); Heng-Yuan Lee, Zhudong Township (TW); Po-Chun Yeh, Taichung (TW); Chih-Yao Wang, Taichung (TW); Hsin-Yun Yang, Taichung (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 16/270,706

(22) Filed: Feb. 8, 2019

(65) Prior Publication Data
US 2020/0194443 A1    Jun. 18, 2020

(30) Foreign Application Priority Data
Dec. 13, 2018  (TW) .............................. 107144958 A

(51) Int. Cl.
*H01L 27/11507*  (2017.01)
*G11C 11/22*  (2006.01)
*H01L 49/02*  (2006.01)

(52) U.S. Cl.
CPC ...... *H01L 27/11507* (2013.01); *G11C 11/221* (2013.01); *H01L 28/60* (2013.01); *H01L 28/65* (2013.01)

(58) Field of Classification Search
CPC .......................... H01L 27/11507; H01L 28/60
See application file for complete search history.

(56) References Cited

U.S. PATENT DOCUMENTS

| | | | |
|---|---|---|---|
| 6,635,498 B2 | 10/2003 | Summerfelt et al. | |
| 9,053,802 B2 | 6/2015 | Müller et al. | |
| 9,779,797 B2 | 10/2017 | Ino et al. | |
| 9,818,468 B2 | 11/2017 | Müller | |
| 2010/0006953 A1* | 1/2010 | Boescke ................. | G11C 11/22 257/410 |
| 2010/0279844 A1 | 11/2010 | Hackenberger et al. | |
| 2015/0214322 A1 | 7/2015 | Mueller et al. | |
| 2016/0276014 A1 | 9/2016 | Fox et al. | |
| 2017/0162250 A1 | 6/2017 | Slesazeck et al. | |

(Continued)

FOREIGN PATENT DOCUMENTS

CN    1319256 A    10/2001
TW    436931 B    5/2001

OTHER PUBLICATIONS

Taiwanese Office Action and Search Report for Taiwanese Application No. 107144958, dated Jul. 15, 2019.

(Continued)

*Primary Examiner* — Eugene Lee
(74) *Attorney, Agent, or Firm* — Birch, Stewart, Kolasch & Birch, LLP

(57) ABSTRACT

A ferroelectric memory is provided. The ferroelectric memory includes a first electrode, a second electrode opposite to the first electrode, at least one ferroelectric layer disposed between the first electrode and the second electrode, and at least one antiferroelectric layer disposed between the first electrode and the second electrode, wherein the antiferroelectric layer is in contact with the ferroelectric layer.

16 Claims, 6 Drawing Sheets

(56) References Cited

U.S. PATENT DOCUMENTS

2017/0256552 A1 9/2017 Schröder et al.
2018/0233573 A1 8/2018 Lin et al.
2019/0348539 A1* 11/2019 Yoo .................. H01L 29/78391

OTHER PUBLICATIONS

A-Paz De Araujo et al., "Fatigue-free ferroelectric capacitors with platinum electrodes", Nature, vol. 374, Apr. 13, 1995, pp. 627-629.
Böscke et al., "Phase transitions in ferroelectric silicon doped hafnium oxide", Applied Physics Letters, vol. 99, No. 112904, 2011, pp. 112904-1-112904-3.
Ciuchi et al., "Field-induced antiferroelectric to ferroelectric transitions in $(Pb_{1-x}La_x)(Zr_{0.90}Ti_{0.10})_{1-x/4}O_3$ investigated by in situ X-ray diffraction", Journal of the European Ceramic Society, vol. 37, 2017, pp. 4631-4636.
Fengler et al., "Comparison of hafnia and PZT based ferroelectrics for future non-volatile FRAM applications", IEEE, 2016, pp. 369-372.
Lowther et al., "Relative stability of $ZrO_2$ and $HfO_2$ structural phases", The American Physical Society, Physical Review B, vol. 60, No. 21, Dec. 1, 1999, pp. 14485-14488.
Park et al., "Evolution of phases and ferroelectric properties of thin $Hf_{0.5}Zr_{0.5}O_2$ films according to the thickness and annealing temperature", Applied Physics Letiers, vol. 102, No. 242905, 2013, pp. 242905-1-242905-5.
Yoo et al., "Highly Reliable 50nm-thick PZT Capacitor and Low Voltage FRAM Device using $Ir/SrRuO_3$/MOCVD PZT Capacitor Technology", 2005 Symposium on VLSI Technology Digest of Technical Papers, 2005, pp. 100-101.

\* cited by examiner

US 10,833,091 B2

FERROELECTRIC MEMORIES

CROSS REFERENCE TO RELATED APPLICATIONS

This application claims priority of Taiwan Patent Application No. 107144958, filed on Dec. 13, 2018, the entirety of which is incorporated by reference herein.

TECHNICAL FIELD

The disclosure relates to a ferroelectric memory, and relates to a ferroelectric memory that can increase the number of operations.

BACKGROUND

Ferroelectric memories are destructive read memories and require a high number of operations. Therefore, it's valuable to know how to increase the number of operations. Traditionally, the ferroelectric memory technology is based on hafnium oxide (HfO) materials; its operational degradation is mostly generated after $10^6$ cycles, which does not meet the industrial needs.

SUMMARY

In accordance with one embodiment of the disclosure, a ferroelectric memory is provided. The ferroelectric memory includes a first electrode, a second electrode opposite to the first electrode, at least one ferroelectric layer disposed between the first electrode and the second electrode, and at least one antiferroelectric layer disposed between the first electrode and the second electrode, wherein the antiferroelectric layer is in contact with the ferroelectric layer.

In one embodiment, the at least one ferroelectric layer includes one ferroelectric layer, the at least one antiferroelectric layer includes one antiferroelectric layer, the ferroelectric layer is disposed between the first electrode and the second electrode, and the antiferroelectric layer is disposed between the first electrode and the ferroelectric layer.

In another embodiment, the at least one ferroelectric layer includes one ferroelectric layer, the at least one antiferroelectric layer includes a first antiferroelectric layer and a second antiferroelectric layer, the ferroelectric layer is disposed between the first electrode and the second electrode, the first antiferroelectric layer is disposed between the first electrode and the ferroelectric layer, and the second antiferroelectric layer is disposed between the second electrode and the ferroelectric layer.

In another embodiment, the at least one ferroelectric layer includes a plurality of ferroelectric layers, the at least one antiferroelectric layer includes a plurality of antiferroelectric layers, and the plurality of ferroelectric layers and the plurality of antiferroelectric layers are disposed between the first electrode and the second electrode and alternately arranged in a horizontal direction.

In another embodiment, the at least one ferroelectric layer includes one ferroelectric layer, the at least one antiferroelectric layer includes one antiferroelectric layer, the ferroelectric layer is disposed between the first electrode and the second electrode, and the antiferroelectric layer is disposed between the second electrode and the ferroelectric layer.

In another embodiment, the at least one ferroelectric layer includes a first ferroelectric layer and a second ferroelectric layer, the at least one antiferroelectric layer includes one antiferroelectric layer, the antiferroelectric layer is disposed between the first electrode and the second electrode, the first ferroelectric layer is disposed between the first electrode and the antiferroelectric layer, and the second ferroelectric layer is disposed between the second electrode and the antiferroelectric layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is determined by reference to the appended claims.

In order to increase the number of operations of ferroelectric memories, the disclosure provides a ferroelectric memory. An antiferroelectric (AFE) layer with ferroelectric-delayed wake-up property is combined with a ferroelectric (FE) layer and applied to the ferroelectric memory, wherein the antiferroelectric (AFE) layer is in contact with the ferroelectric (FE) layer.

Figure 1:
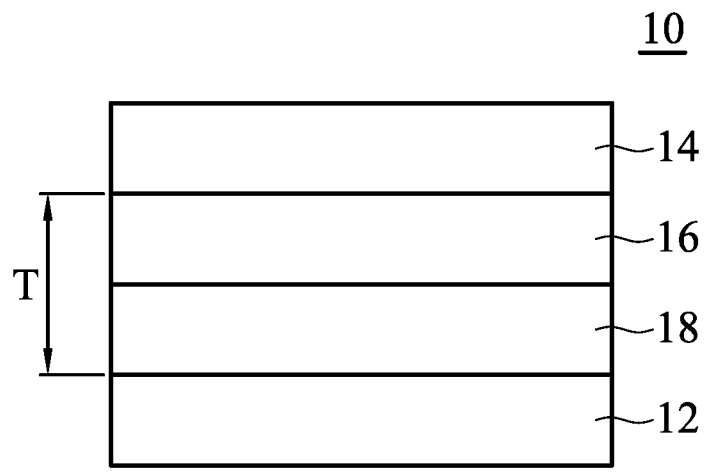
FIG. 1 is a cross-sectional view of a ferroelectric memory in accordance with one embodiment of the disclosure.

Referring to FIG. 1, in accordance with one embodiment of the disclosure, a ferroelectric memory 10 is provided. FIG. 1 is a cross-sectional view of the ferroelectric memory 10.

The ferroelectric memory (ferroelectric RAM) 10 includes a first electrode 12, a second electrode 14, a ferroelectric layer 16, and an antiferroelectric layer 18. The first electrode 12 is opposite to the second electrode 14. The ferroelectric layer 16 is disposed between the first electrode 12 and the second electrode 14. The antiferroelectric layer 18 is disposed between the first electrode 12 and the ferroelectric layer 16. The antiferroelectric layer 18 is in contact with the ferroelectric layer 16.

In some embodiments, the first electrode 12 and the second electrode 14 may include, for example, semiconductor, conductive dielectric or metal. In one embodiment, the first electrode 12 and the second electrode 14 may include the following materials, but not limited thereto, for example, zirconium (Zr), hafnium (Hf), titanium oxide ($TiO_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide (SiO$_x$), silicon nitride (SiN$_x$), silicon oxynitride (SiON$_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

In one embodiment, the ferroelectric layer 16 may include the following materials, but not limited thereto, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the ferroelectric layer 16 is hafnium zirconium oxide (HfZrO$_x$). In hafnium zirconium oxide (HfZrO$_x$), the content of hafnium is higher than that of zirconium.

In one embodiment, the antiferroelectric layer 18 may include the following materials, but not limited thereto, for example, hafnium zirconium oxide (HfZrO$_x$), zirconium oxide (ZrO$_x$), hafnium silicon oxide (HfSiO$_x$), hafnium aluminum oxide (HfAlO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the antiferroelectric layer 18 is hafnium zirconium oxide (HfZrO$_x$). In hafnium zirconium oxide (HfZrO$_x$), the content of zirconium is higher than that of hafnium.

In one embodiment, the compositions of the ferroelectric layer 16 and the antiferroelectric layer 18 may be similar materials to avoid creating an interface between the two layers. In some embodiments, the thickness of the ferroelectric layer 16 may be the same as or different from that of the antiferroelectric layer 18. In some embodiments, the total thickness "T" of the ferroelectric layer 16 and the antiferroelectric layer 18 is in a range from about 5 nm to about 15 nm.

Figure 2:
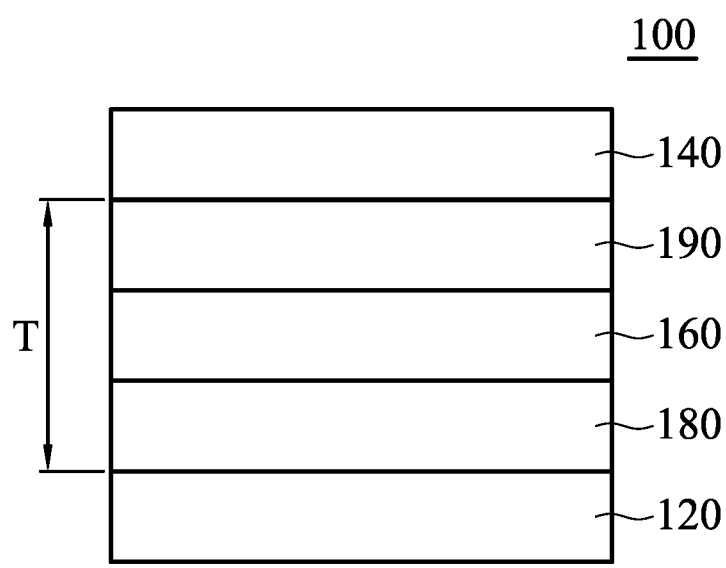
FIG. 2 is a cross-sectional view of a ferroelectric memory in accordance with one embodiment of the disclosure.

Referring to FIG. 2, in accordance with one embodiment of the disclosure, a ferroelectric memory 100 is provided. FIG. 2 is a cross-sectional view of the ferroelectric memory 100.

The ferroelectric memory (ferroelectric RAM) 100 includes a first electrode 120, a second electrode 140, a ferroelectric layer 160, a first antiferroelectric layer 180, and a second antiferroelectric layer 190. The first electrode 120 is opposite to the second electrode 140. The ferroelectric layer 160 is disposed between the first electrode 120 and the second electrode 140. The first antiferroelectric layer 180 is disposed between the first electrode 120 and the ferroelectric layer 160. The second antiferroelectric layer 190 is disposed between the second electrode 140 and the ferroelectric layer 160. The first antiferroelectric layer 180 and the second antiferroelectric layer 190 are in contact with the ferroelectric layer 160.

In one embodiment, the first electrode 120 and the second electrode 140 may include, for example, semiconductor, conductive dielectric or metal. In some embodiments, the first electrode 120 and the second electrode 140 may include the following materials, but not limited thereto, for example, zirconium (Zr), hafnium (Hf), titanium oxide (TiO$_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide (SiO$_x$), silicon nitride (SiN$_x$), silicon oxynitride (SiON$_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

In one embodiment, the ferroelectric layer 160 may include the following materials, but not limited thereto, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the ferroelectric layer 160 is hafnium zirconium oxide (HfZrO$_x$). In hafnium zirconium oxide (HfZrO$_x$), the content of hafnium is higher than that of zirconium.

In one embodiment, the first antiferroelectric layer 180 and the second antiferroelectric layer 190 may include the following materials, but not limited thereto, for example, hafnium zirconium oxide (HfZrO$_x$), zirconium oxide (ZrO$_x$), hafnium silicon oxide (HfSiO$_x$), hafnium aluminum oxide (HfAlO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the first antiferroelectric layer 180 and the second antiferroelectric layer 190 are hafnium zirconium oxide (HfZrO$_x$). In hafnium zirconium oxide (HfZrO$_x$), the content of zirconium is higher than that of hafnium.

In one embodiment, the compositions of the ferroelectric layer 160, the first antiferroelectric layer 180 and the second antiferroelectric layer 190 may be similar materials to avoid creating interfaces between the layers. In some embodiments, the thickness of the ferroelectric layer 160, the first antiferroelectric layer 180 and the second antiferroelectric layer 190 may be the same or different therebetween. In some embodiments, the total thickness "T" of the ferroelectric layer 160, the first antiferroelectric layer 180 and the second antiferroelectric layer 190 is in a range from about 5 nm to about 15 nm.

Figure 3:
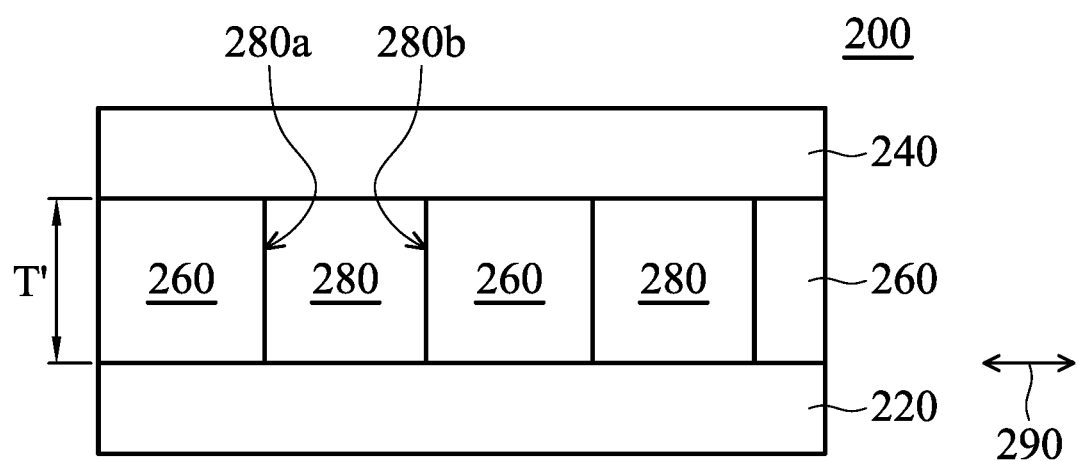
FIG. 3 is a cross-sectional view of a ferroelectric memory in accordance with one embodiment of the disclosure.

Referring to FIG. 3, in accordance with one embodiment of the disclosure, a ferroelectric memory 200 is provided. FIG. 3 is a cross-sectional view of the ferroelectric memory 200.

The ferroelectric memory (ferroelectric RAM) 200 includes a first electrode 220, a second electrode 240, a plurality of ferroelectric layers 260, and a plurality of antiferroelectric layers 280. The first electrode 220 is opposite to the second electrode 240. The ferroelectric layers 160 and the antiferroelectric layers 280 are disposed between the first electrode 220 and the second electrode 240 and alternately arranged in a horizontal direction 290. The antiferroelectric layers 280 are in contact with the ferroelectric layers 260, for example, the both sides (280a and 280b) of the antiferroelectric layers 280 are in contact with the adjacent ferroelectric layers 260.

In one embodiment, the first electrode 220 and the second electrode 240 may include, for example, semiconductor, conductive dielectric or metal. In some embodiments, the first electrode 220 and the second electrode 240 may include the following materials, but not limited thereto, for example, zirconium (Zr), hafnium (Hf), titanium oxide (TiO$_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide (SiO$_x$), silicon nitride (SiN$_x$), silicon oxynitride (SiON$_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

In one embodiment, the ferroelectric layers 260 may include the following materials, but not limited thereto, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the ferroelectric layers 260 are hafnium zirconium oxide (HfZrO$_x$). In hafnium zirconium oxide (HfZrO$_x$), the content of hafnium is higher than that of zirconium.

In one embodiment, the antiferroelectric layers 280 may include the following materials, but not limited thereto, for example, hafnium zirconium oxide (HfZrO$_x$), zirconium oxide (ZrO$_x$), hafnium silicon oxide (HfSiO$_x$), hafnium aluminum oxide (HfAlO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the antiferroelectric layers 280 are hafnium zirconium oxide (HfZrO$_x$). In hafnium zirconium oxide (HfZrO$_x$), the content of zirconium is higher than that of hafnium.

In one embodiment, the compositions of the ferroelectric layers 260 and the antiferroelectric layers 280 may be similar materials to avoid creating interfaces between the layers. In one embodiment, the total thickness T' of the ferroelectric layer 260 and the antiferroelectric layer 280 is in a range from about 5 nm to about 15 nm.

Figure 4:
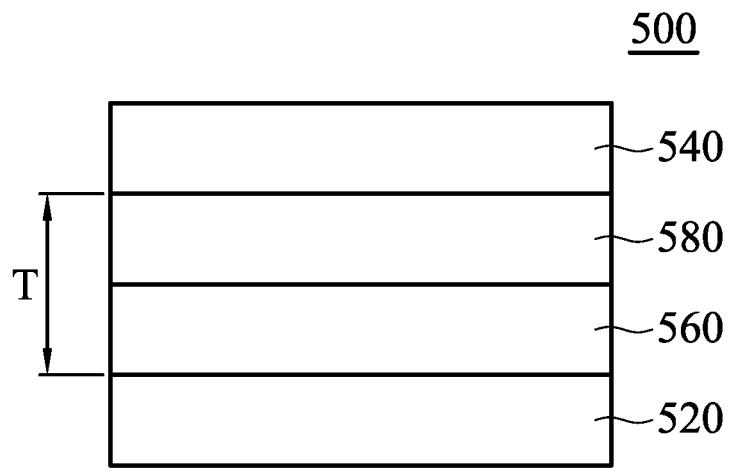
FIG. 4 is a cross-sectional view of a ferroelectric memory in accordance with one embodiment of the disclosure.

Referring to FIG. 4, in accordance with one embodiment of the disclosure, a ferroelectric memory 500 is provided. FIG. 4 is a cross-sectional view of the ferroelectric memory 500.

The ferroelectric memory (ferroelectric RAM) 500 includes a first electrode 520, a second electrode 540, a ferroelectric layer 560, and an antiferroelectric layer 580. The first electrode 520 is opposite to the second electrode 540. The ferroelectric layer 560 is disposed between the first electrode 520 and the second electrode 540. The antiferroelectric layer 580 is disposed between the second electrode 540 and the ferroelectric layer 560. The antiferroelectric layer 580 is in contact with the ferroelectric layer 560.

In one embodiment, the first electrode 520 and the second electrode 540 may include, for example, semiconductor, conductive dielectric or metal. In some embodiments, the first electrode 520 and the second electrode 540 may include the following materials, but not limited thereto, for example, zirconium (Zr), hafnium (Hf), titanium oxide (TiO$_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide (SiO$_x$), silicon nitride (SiN$_x$), silicon oxynitride (SiON$_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

In one embodiment, the ferroelectric layer 560 may include the following materials, but not limited thereto, for example, hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the ferroelectric layer 560 is hafnium zirconium oxide (HfZrO$_x$). In hafnium zirconium oxide (HfZrO$_x$), the content of hafnium is higher than that of zirconium.

In one embodiment, the antiferroelectric layer 580 may include the following materials, but not limited thereto, for example, hafnium zirconium oxide (HfZrO$_x$), zirconium oxide (ZrO$_x$), hafnium silicon oxide (HfSiO$_x$), hafnium aluminum oxide (HfAlO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), or barium titanate (BaTiO$_3$).

In this embodiment, the antiferroelectric layer 580 is hafnium zirconium oxide (HfZrO$_x$). In hafnium zirconium oxide (HfZrO$_x$), the content of zirconium is higher than that of hafnium.

In one embodiment, the compositions of the ferroelectric layer 560 and the antiferroelectric layer 580 may be similar materials to avoid creating an interface between the two layers. In some embodiments, the thickness of the ferroelectric layer 560 may be the same as or different from that of the antiferroelectric layer 580. In some embodiments, the total thickness "T" of the ferroelectric layer 560 and the antiferroelectric layer 580 is in a range from about 5 nm to about 15 nm.

Figure 5:
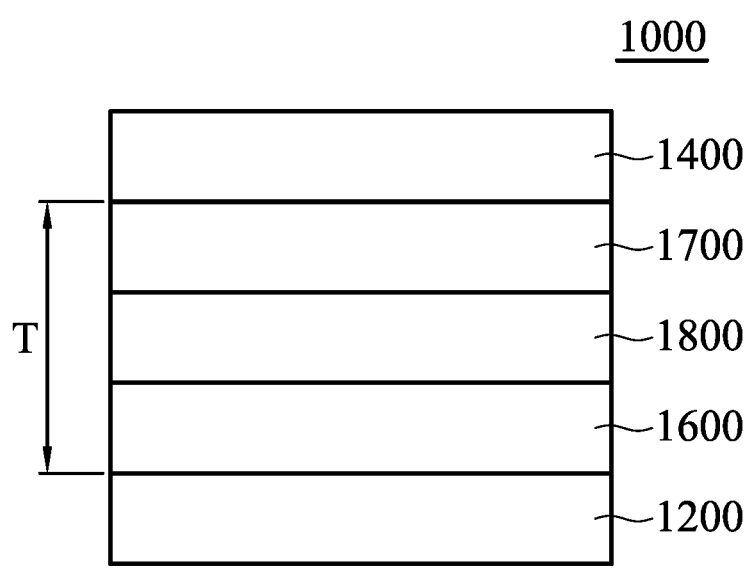
FIG. 5 is a cross-sectional view of a ferroelectric memory in accordance with one embodiment of the disclosure.

Referring to FIG. 5, in accordance with one embodiment of the disclosure, a ferroelectric memory 1000 is provided. FIG. 5 is a cross-sectional view of the ferroelectric memory 1000.

The ferroelectric memory (ferroelectric RAM) 1000 includes a first electrode 1200, a second electrode 1400, a first ferroelectric layer 1600, a second ferroelectric layer 1700, and an antiferroelectric layer 1800. The first electrode 1200 is opposite to the second electrode 1400. The antiferroelectric layer 1800 is disposed between the first electrode 1200 and the second electrode 1400. The first ferroelectric layer 1600 is disposed between the first electrode 1200 and the antiferroelectric layer 1800. The second ferroelectric layer 1700 is disposed between the second electrode 1400 and the antiferroelectric layer 1800. The first ferroelectric layer 1600 and the second ferroelectric layer 1700 are in contact with the antiferroelectric layer 1800.

In one embodiment, the first electrode 1200 and the second electrode 1400 may include, for example, semiconductor, conductive dielectric or metal. In one embodiment, the first electrode 1200 and the second electrode 1400 may include the following materials, but not limited thereto, for example, zirconium (Zr), hafnium (Hf), titanium oxide (TiO$_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide ($SiO_x$), silicon nitride ($SiN_x$), silicon oxynitride ($SiON_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

In one embodiment, the first ferroelectric layer 1600 and the second ferroelectric layer 1700 may include the following materials, but not limited thereto, for example, hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), or barium titanate ($BaTiO_3$).

In this embodiment, the first ferroelectric layer 1600 and the second ferroelectric layer 1700 are hafnium zirconium oxide ($HfZrO_x$). In hafnium zirconium oxide ($HfZrO_x$), the content of hafnium is higher than that of zirconium.

In one embodiment, the antiferroelectric layer 1800 may include the following materials, but not limited thereto, for example, hafnium zirconium oxide ($HfZrO_x$), zirconium oxide ($ZrO_x$), hafnium silicon oxide ($HfSiO_x$), hafnium aluminum oxide ($HfAlO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), or barium titanate ($BaTiO_3$).

In this embodiment, the antiferroelectric layer 1800 is hafnium zirconium oxide ($HfZrO_x$). In hafnium zirconium oxide ($HfZrO_x$), the content of zirconium is higher than that of hafnium.

In one embodiment, the compositions of the first ferroelectric layer 1600, the second ferroelectric layer 1700 and the antiferroelectric layer 1800 may be similar materials to avoid creating interfaces between the layers. In one embodiment, the thickness of the first ferroelectric layer 1600, the second ferroelectric layer 1700 and the antiferroelectric layer 1800 may be the same or different therebetween. In some embodiments, the total thickness "T" of the first ferroelectric layer 1600, the second ferroelectric layer 1700 and the antiferroelectric layer 1800 is in a range from about 5 nm to about 15 nm.

EXAMPLES

Example 1

Figure 6:
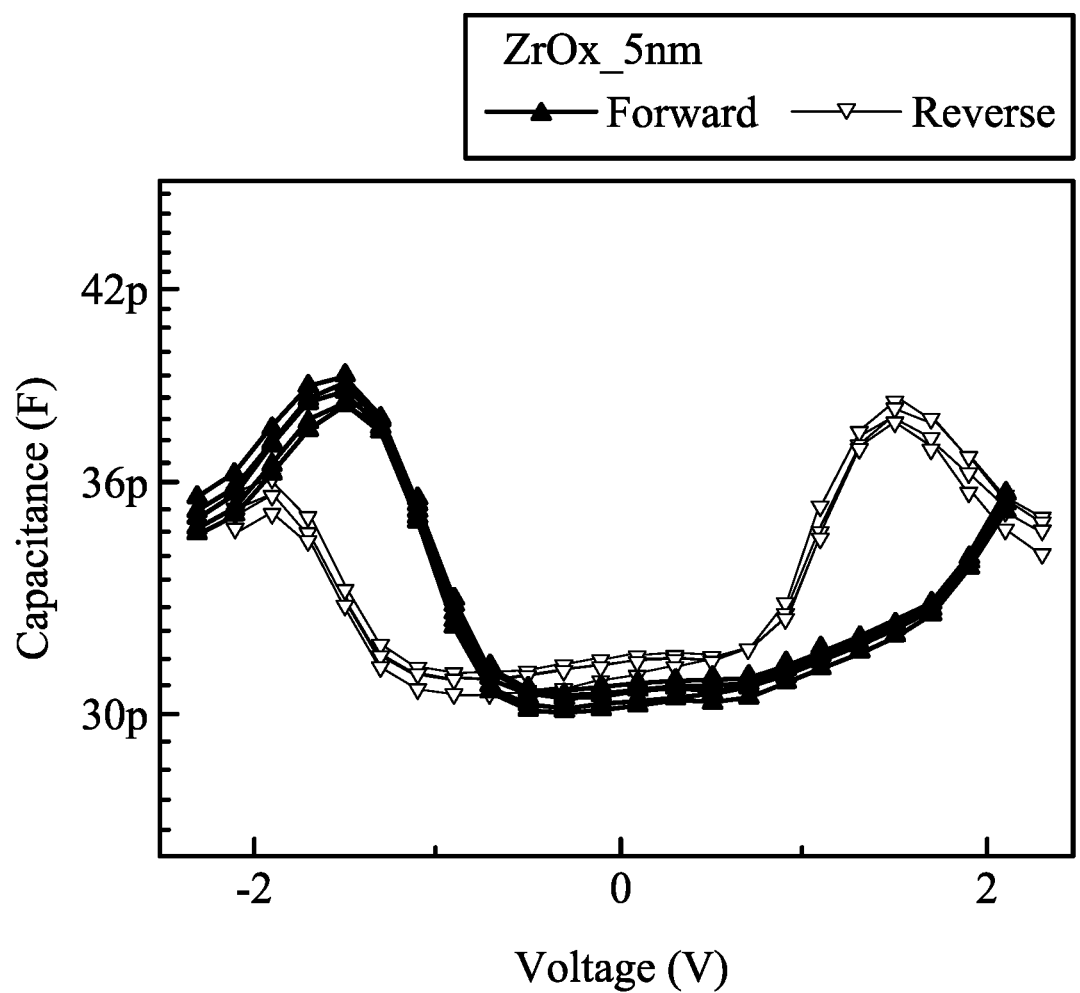
FIG. 6 is a capacitance-voltage characteristic diagram of an antiferroelectric layer in accordance with one embodiment of the disclosure.

Measurement of the Capacitance-Voltage Characteristic of the Antiferroelectric (AFE) Layer In this example, the capacitance-voltage characteristics of the zirconium oxide (ZrO) antiferroelectric (AFE) layer having a thickness of 5 nm was measured, and the measurement results are shown in FIG. 6. In FIG. 6, according to the curve of the capacitance value of the antiferroelectric layer with the applied voltage, the zirconium oxide (ZrO) component has antiferroelectric characteristics. In the process of applying voltage, the characteristic of the antiferroelectric layer is converted from the originally antiferroelectric characteristic into the ferroelectric characteristic so that the antiferroelectric layer has a ferroelectric-delayed wake-up characteristic. If the antiferroelectric layer with the ferroelectric-delayed wake-up characteristic is applied to the ferroelectric memory of the disclosure, the fatigue effect of the ferroelectric layer is effectively compensated.

Example 2

Figure 7:
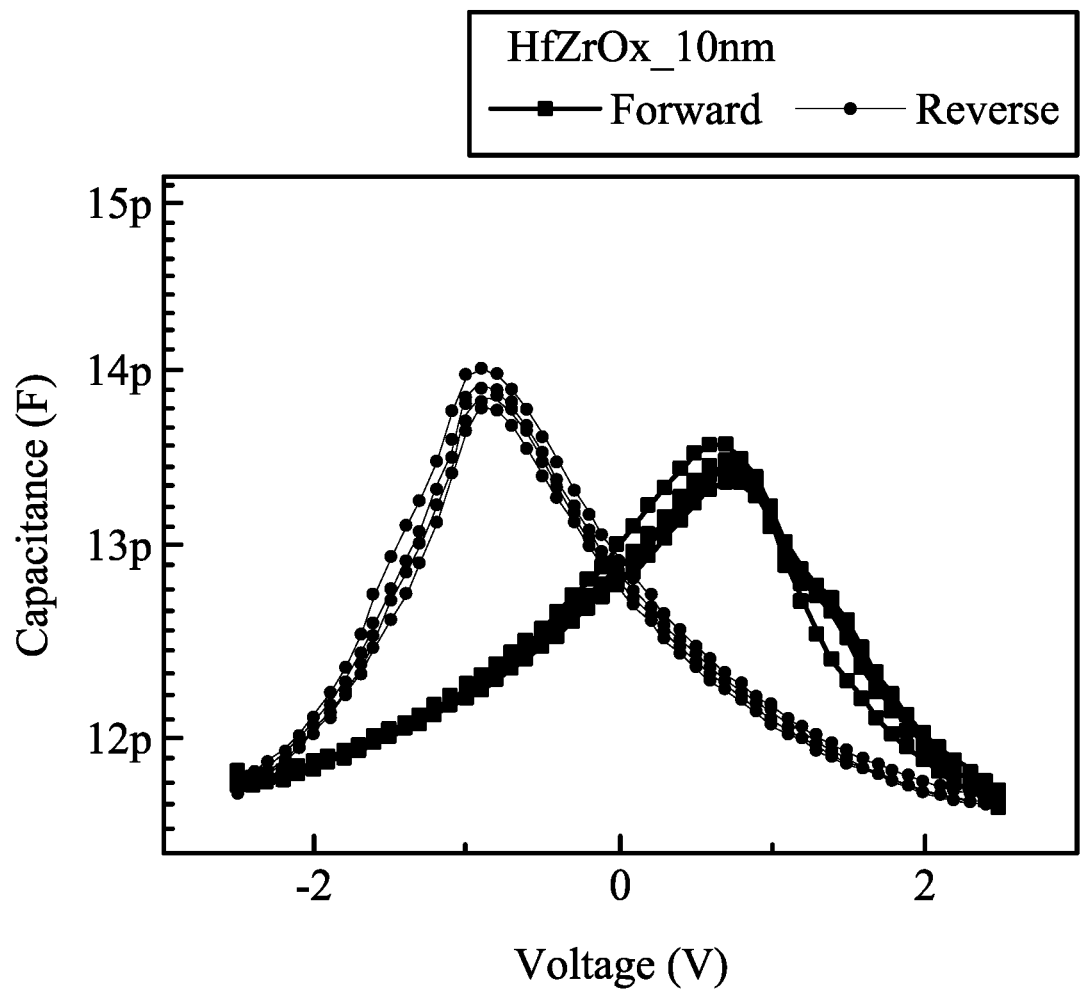
FIG. 7 is a capacitance-voltage characteristic diagram of a ferroelectric layer in accordance with one embodiment of the disclosure.

Measurement of the Capacitance-Voltage Characteristic of the Ferroelectric (FE) Layer In this example, the capacitance-voltage characteristics of the zirconium oxide (HfZrO) ferroelectric (FE) layer having a thickness of 10 nm was measured, and the measurement results are shown in FIG. 7. In FIG. 7, according to the curve of the capacitance value of the ferroelectric layer with the applied voltage, the zirconium oxide (HfZrO) component has ferroelectric characteristics. In the process of applying voltage, the ferroelectric layer gradually produced the fatigue effect, resulting in decrease of the polarization thereof. If the ferroelectric layer is combined with the antiferroelectric layer with the ferroelectric-delayed wake-up characteristic of Example 1 and applied to the ferroelectric memory of the disclosure, the fatigue effect produced by the ferroelectric layer is effectively compensated.

Example 3

The Relationship Between the Charge Amount and the Number of Operations of the Ferroelectric Memory In this example, the variation in charge amount of three ferroelectric memories (Devices A, B and C) under different numbers of operations was measured. Device A was an antiferroelectric device composed of a 5 nm-thick zirconium oxide (HfZrO) antiferroelectric layer. Device B was a ferroelectric device composed of a 10 nm-thick zirconium oxide (HfZrO) ferroelectric layer. Device C was an integrated device composed of a 5 nm-thick zirconium oxide (HfZrO) antiferroelectric layer and a 5 nm-thick zirconium oxide (HfZrO) ferroelectric layer. In Device A, the variation in charge amount thereof was measured under the strength of the electric field of 2.8 MV/cm and the operating frequency of 5 M-Hz. In Device B, the variation in charge amount thereof was measured under the strength of the electric field of 2.0 MV/cm and the operating frequency of 5 M-Hz. In Device C, the variation in charge amount thereof was measured under the strength of the electric field of 2.4 MV/cm and the operating frequency of 5 M-Hz. The measurement results (curves A, B and C) of Devices A, B and C are shown in FIG. 8.

Figure 8:
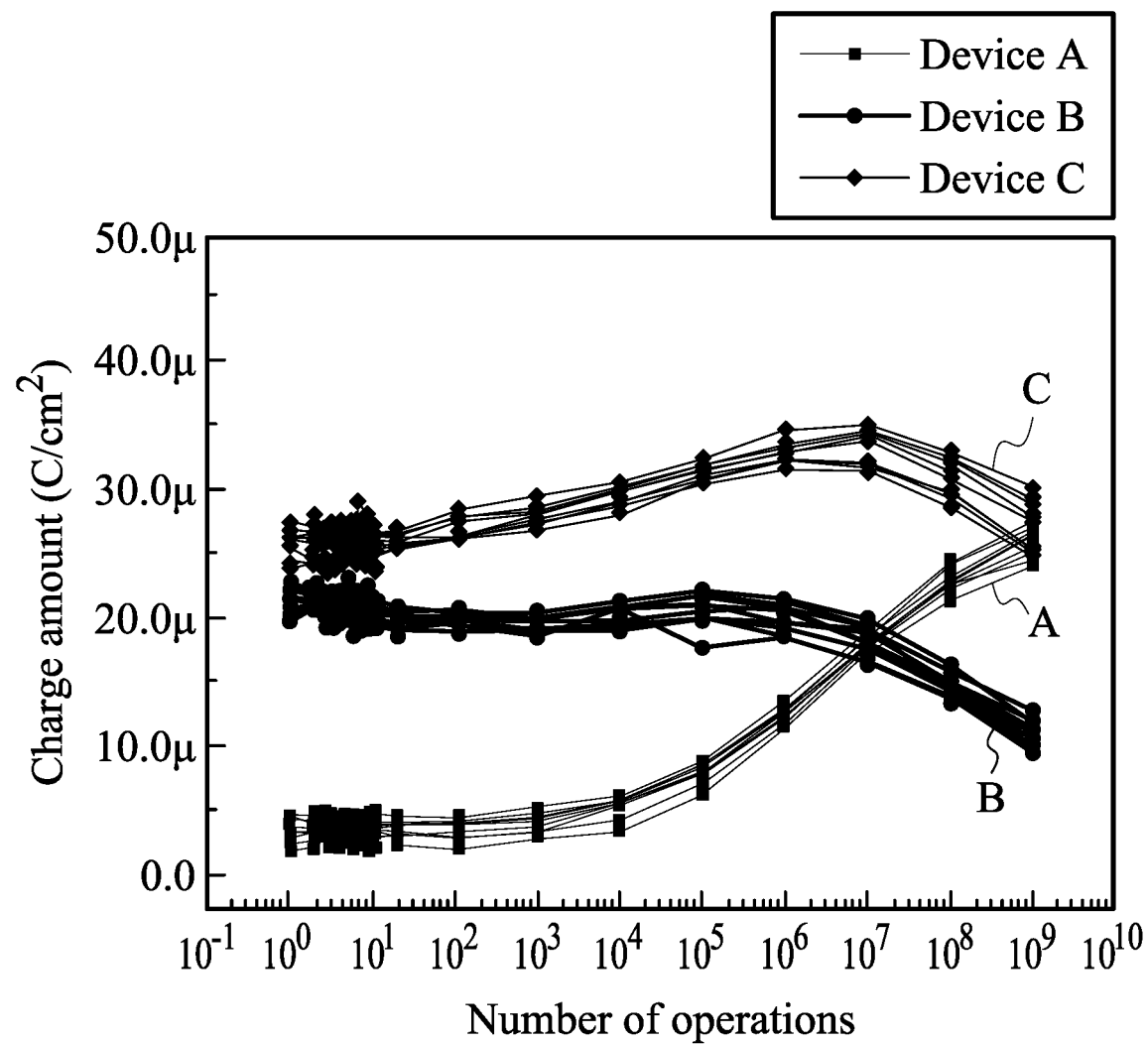
FIG. 8 shows a relationship between the charge amount and the number of operations of a ferroelectric memory in accordance with one embodiment of the disclosure.

In FIG. 8, according to the curve of the charge amount of each device with the number of operations, the charge amount of Device A (the curve A) increased as the number of operations increased, which means that Device A had ferroelectric-delayed wake-up characteristic. The charge amount of Device B (the curve B) began to decrease as the number of operations was increased to a specific value (for example, after the number of operations reached $10^5$), which means that Device B produced the fatigue effect after the number of operations reached $10^5$. The charge amount of Device C (the curve C) was increased first and then decreased as the number of operations increased, which means that although the ferroelectric layer disposed in Device C produced the fatigue effect, the antiferroelectric layer disposed in Device C simultaneously induced the ferroelectric-delayed wake-up characteristic, and this phenomenon effectively compensated for the fatigue effect generated by the ferroelectric layer. Therefore, it can be seen from the curve C that the charge amount of Device C gradually decreased after the number of operations reached $10^7$ ($>10^5$). Device C can effectively increase the number of operations thereof compared to Device B.

The disclosure applies an antiferroelectric (AFE) layer with a ferroelectric-delayed wake-up property and a ferroelectric (FE) layer to the ferroelectric memory, and the antiferroelectric (AFE) layer is in contact with the ferroelectric (FE) layer. Although the ferroelectric layer generates a fatigue effect during the operation of the component, the property of the antiferroelectric layer in the component is converted from the originally antiferroelectric property to the ferroelectric property, and thus the ferroelectric-delayed wake-up property is provided. This phenomenon can just compensate for the fatigue effect generated by the ferroelectric layer, thereby effectively improving the number of operations of the component by $10^{10}$ or more, and slowing down the operation deterioration.

While the disclosure has been described by way of example and in terms of embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A ferroelectric memory, comprising:
   a first electrode;
   a second electrode opposite to the first electrode;
   at least one ferroelectric layer disposed between the first electrode and the second electrode; and
   at least one antiferroelectric layer disposed between the first electrode and the second electrode, wherein the antiferroelectric layer is in contact with the ferroelectric layer, wherein the at least one ferroelectric layer comprises a plurality of ferroelectric layers, the at least one antiferroelectric layer comprises a plurality of antiferroelectric layers, and the plurality of ferroelectric layers and the plurality of antiferroelectric layers are disposed between the first electrode and the second electrode and the one ferroelectric layer and the one antiferroelectric layer are alternately arranged in a horizontal direction.

2. The ferroelectric memory as claimed in claim 1, wherein the at least one ferroelectric layer comprises one ferroelectric layer, the at least one antiferroelectric layer comprises one antiferroelectric layer, the ferroelectric layer is disposed between the first electrode and the second electrode, and the antiferroelectric layer is disposed between the first electrode and the ferroelectric layer.

3. The ferroelectric memory as claimed in claim 2, wherein one ferroelectric layer and one antiferroelectric layer have a total thickness which is in a range from 5 nm to 15 nm.

4. The ferroelectric memory as claimed in claim 1, wherein the at least one ferroelectric layer comprises one ferroelectric layer, the at least one antiferroelectric layer comprises a first antiferroelectric layer and a second antiferroelectric layer, the ferroelectric layer is disposed between the first electrode and the second electrode, the first antiferroelectric layer is disposed between the first electrode and the ferroelectric layer, and the second antiferroelectric layer is disposed between the second electrode and the ferroelectric layer.

5. The ferroelectric memory as claimed in claim 4, wherein one ferroelectric layer, the first antiferroelectric layer and the second antiferroelectric layer have a total thickness which is in a range from 5 nm to 15 nm.

6. The ferroelectric memory as claimed in claim 1, wherein the ferroelectric layer and the antiferroelectric layer respectively has a thickness which is in a range from 5 nm to 15 nm.

7. The ferroelectric memory as claimed in claim 1, wherein the at least one ferroelectric layer comprises one ferroelectric layer, the at least one antiferroelectric layer comprises one antiferroelectric layer, the ferroelectric layer is disposed between the first electrode and the second electrode, and the antiferroelectric layer is disposed between the second electrode and the ferroelectric layer.

8. The ferroelectric memory as claimed in claim 7, wherein one ferroelectric layer and one antiferroelectric layer have a total thickness which is in a range from 5 nm to 15 nm.

9. The ferroelectric memory as claimed in claim 1, wherein the at least one ferroelectric layer comprises a first ferroelectric layer and a second ferroelectric layer, the at least one antiferroelectric layer comprises one antiferroelectric layer, the antiferroelectric layer is disposed between the first electrode and the second electrode, the first ferroelectric layer is disposed between the first electrode and the antiferroelectric layer, and the second ferroelectric layer is disposed between the second electrode and the antiferroelectric layer.

10. The ferroelectric memory as claimed in claim 9, wherein the first ferroelectric layer, the second ferroelectric layer and one antiferroelectric layer have a total thickness which is in a range from 5 nm to 15 nm.

11. The ferroelectric memory as claimed in claim 1, wherein the first electrode and the second electrode comprise semiconductor, conductive dielectric or metal.

12. The ferroelectric memory as claimed in claim 11, wherein the first electrode and the second electrode comprise zirconium (Zr), hafnium (Hf), titanium oxide ($TiO_x$), titanium nitride (TiN), titanium (Ti), titanium oxynitride (TiON), tantalum (Ta), tantalum nitride (TaN), tantalum silicide (TaSi), tantalum carbonitride (TaCN), titanium aluminum nitride (TiAlN), zinc (Zn), zinc oxide (ZnO), nickel (Ni), nickel silicide (NiSi), carbon (C), silicon (Si), silicon oxide ($SiO_x$), silicon nitride ($SiN_x$), silicon oxynitride ($SiON_x$), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga), or gallium nitride (GaN).

13. The ferroelectric memory as claimed in claim 1, wherein the ferroelectric layer comprises hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), or barium titanate ($BaTiO_3$), wherein, in hafnium zirconium oxide ($HfZrO_x$), hafnium has a content higher than that of zirconium.

14. The ferroelectric memory as claimed in claim 13, wherein when the ferroelectric layer is hafnium zirconium oxide ($HfZrO_x$), hafnium has a content which is higher than that of zirconium.

15. The ferroelectric memory as claimed in claim 1, wherein the antiferroelectric layer comprises hafnium zirconium oxide ($HfZrO_x$), zirconium oxide ($ZrO_x$), hafnium silicon oxide ($HfSiO_x$), hafnium aluminum oxide ($HfAlO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), or barium titanate ($BaTiO_3$), wherein, in hafnium zirconium oxide ($HfZrO_x$), zirconium has a content higher than that of hafnium.

16. The ferroelectric memory as claimed in claim 15, wherein when the antiferroelectric layer is hafnium zirconium oxide (HfZrO$_x$), zirconium has a content which is higher than that of hafnium.

\* \* \* \* \*